United States Patent
Chitaka et al.

(10) Patent No.: US 9,723,739 B2
(45) Date of Patent: Aug. 1, 2017

(54) ELECTRONIC CONTROL UNIT AND PROTECTIVE CASE

(71) Applicant: DENSO CORPORATION, Kariya, Aichi-pref. (JP)

(72) Inventors: Hiroki Chitaka, Kariya (JP); Masaru Yokota, Kariya (JP); Mitsuteru Suzaki, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/892,083

(22) PCT Filed: May 16, 2014

(86) PCT No.: PCT/JP2014/002592
§ 371 (c)(1),
(2) Date: Nov. 18, 2015

(87) PCT Pub. No.: WO2014/188691
PCT Pub. Date: Nov. 27, 2014

(65) Prior Publication Data
US 2016/0150660 A1 May 26, 2016

(30) Foreign Application Priority Data
May 22, 2013 (JP) .................... 2013-108108

(51) Int. Cl.
*H05K 5/00* (2006.01)
*H05K 5/06* (2006.01)
*H05K 5/02* (2006.01)

(52) U.S. Cl.
CPC ............ *H05K 5/06* (2013.01); *H05K 5/0004* (2013.01); *H05K 5/0039* (2013.01); *H05K 5/0247* (2013.01)

(58) Field of Classification Search
None
See application file for complete search history.

(56) References Cited

U.S. PATENT DOCUMENTS 6,101,087 A * 8/2000 Sutton ................. B60R 11/0252
361/679.44
6,275,385 B1 * 8/2001 Sahara ................. H05K 7/1414
361/679.54
(Continued)

FOREIGN PATENT DOCUMENTS

JP 2000174468 A 6/2000
JP 2000183542 A 6/2000
(Continued)

OTHER PUBLICATIONS

International Search Report and Written Opinion (in Japanese with English Translation) for PCT/JP2014/002592, mailed Jul. 8, 2014: ISA/JP.
(Continued)

*Primary Examiner* — Courtney Smith
*Assistant Examiner* — Rashen E Morrison
(74) *Attorney, Agent, or Firm* — Harness, Dickey & Pierce, P.L.C.

(57) ABSTRACT

An electronic control unit includes a control board, a battery pack, and a housing that accommodates the control board and the battery pack. The electronic control unit further includes a battery holder that has a bent shape and includes a bottom surface along a longitudinal direction of the battery pack, the battery holder clamping a main body of the battery pack, and a fixing frame that includes a juxtaposing and mounting part on which a plate surface of the control board and the bottom surface of the battery holder are mounted in a state of being adjacent to each other with a boundary line along the longitudinal direction therebetween, the control board and the battery holder being fixed to the juxtaposing
(Continued)

and mounting part. The housing includes an opening portion into which the juxtaposing and mounting part of the fixing frame is inserted, and a back side holding portion that holds the juxtaposing and mounting part at an inner back side of the housing opposed to the opening portion. The fixing frame further includes a sealing front part that closes the opening portion of the housing with the juxtaposing and mounting part accommodated in the housing and that is fixed to the housing in a state of closing the opening portion.

4 Claims, 10 Drawing Sheets

(56) References Cited

U.S. PATENT DOCUMENTS

2014/0125472 A1* 5/2014 Konno ............... B62M 7/02
340/427

2014/0144720 A1* 5/2014 Konno ............... B62M 7/02
180/287
2014/0197789 A1* 7/2014 Ono ............... H01M 10/44
320/109

FOREIGN PATENT DOCUMENTS

| JP | 2000244152 A | 9/2000 |
| JP | 2000244153 A | 9/2000 |
| JP | 2000261166 A | 9/2000 |
| JP | 2006005083 A | 1/2006 |
| JP | 2006086382 A | 3/2006 |
| WO | WO-2012176299 A1 | 12/2012 |

OTHER PUBLICATIONS

U.S. Appl. No. 14/892,075, filed Nov. 18, 2015, Chitaka et al.

* cited by examiner

ELECTRONIC CONTROL UNIT AND PROTECTIVE CASE

CROSS REFERENCE TO RELATED APPLICATIONAPPLICATIONS

This application is a U.S. National Phase Application under 35 U.S.C. 371 of International Application No. PCT/JP2014/002592 filed on May 16, 2014 and published in Japanese as WO 2014/188691 A1 on Nov. 27, 2014. This application is based on and claims the benefit of priority from Japanese Patent Application No. 2013-108108 filed on May 22, 2013. The entire disclosures of all of the above applications are incorporated herein by reference.

TECHNICAL FIELD

The present disclosure relates to an electronic control unit including a control board that has an electronic control circuit mounted with a plurality of electronic parts and that has a plate shape; and a protective case for protecting the control board.

BACKGROUND ART

Conventionally, as a protective case for protecting a control board from outside dust and dirt and rain drops has been generally used a case of the type in which: support rails are provided on the left and right peripheral walls of a housing for housing the control board; the control board is inserted into the housing along the support rails; and the housing is fixed with a cover (for example, see patent document 1).

Further, there has been considered a structure in which, in place of the support rails, a plurality of protruding parts (ribs) are formed on the peripheral wall of a housing alternately in a depth direction of the housing at a spacing corresponding to a designed thickness of the upper and lower surfaces of the control board, whereby even if the control board is formed in a thickness a little larger than a specified spacing of the protruding portion, the control board is bent and inserted along the ribs, thereby being surely fixed in the housing (for example, see patent document 2).

PRIOR ART DOCUMENTS

Patent Documents

Patent Document 1: JP2000-244152A
Patent Document 2: JP2000-244153A

By the way, in recent years has been developed, for example, an electronic control unit called an eCall unit that automatically transmits information relating to the operation of an air bag when a vehicle accident is caused or the sensing information of a crash sensor, a GPS receiver, and the like to a specified center. The electronic control unit like this shall have a backup battery (BUB) that can always supply the electronic control circuit with an electric power so as to be able to respond even in case of emergency such that the supply of the electric power from a vehicle-mounted battery is stopped.

For this reason, in this kind of electronic control device, not only the control board but also the BUB needs to be protected, so it is thought to be desirable that not only the control board but also the BUB (in more detail, a battery pack in which the BUB is housed) can be protected by a protective case.

Figure 10A:
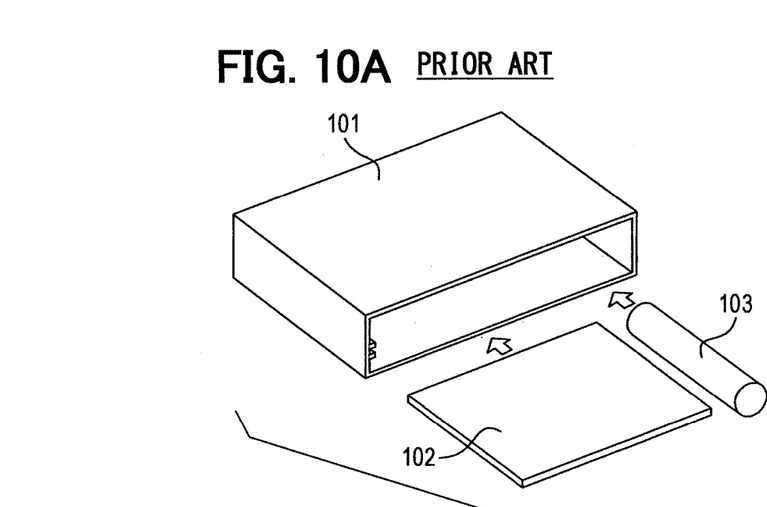
FIG. 10A is an illustration to show a prior art.

However, a conventional protective case employs a structure in which the control board is fixed to the housing by a support rail (or rib). Hence, as shown in FIG. 10A, when a structure is employed in which a control board 102 is fixed only by one support rail (or rib) of support rails (ribs) on the left and right peripheral walls of a housing 101 so as to house the control board 102 and the battery pack 103 side by side in the housing 101, the control board 102 cannot be stably supported in the housing 101. In this way, when the control board 102 is greatly swung by vibration and impact in a vehicle, the electronic control circuit is likely to be erroneously operated or damaged.

Figure 10B:
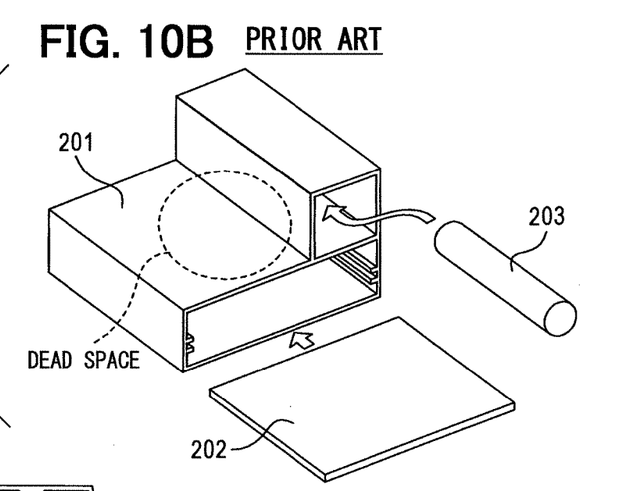
FIG. 10B is an illustration to show a prior art.

Further, as shown in FIG. 10B, when a battery case to house a battery pack 203 is provided integrally with an upper part of a housing 201, a protective case is formed in a protruding shape as a whole. Hence, for example, in the case where the protective case is set in a vehicle, a vacant space around a protruding periphery of the housing 201 easily becomes a dead space in relation to the other device and member set in the vehicle. For this reason, for example, when an electronic control unit is set in a limited space in the vehicle, there is caused a concern that an entire layout will be complicated.

Figure 10C:
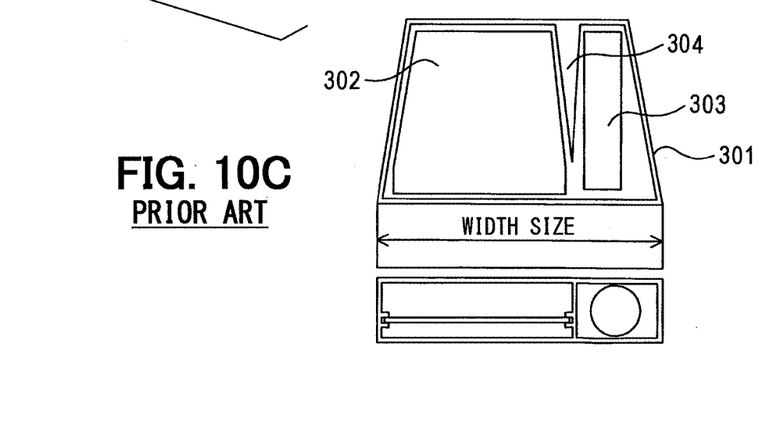
FIG. 10C is an illustration to show a prior art.

Still further, when a battery case is mounted separately from the housing and the housing and the battery case are arranged side by side, it is concerned that the number of parts is increased to thereby increase a manufacturing cost and a management cost. In contrast to this, as shown in FIG. 10C, in the case where a partition wall part 304 for partitioning a space in which a control board 302 is arranged and a space in which a battery pack 303 is arranged is provided in a housing 301 and also a wall part 304 has a support rail to thereby hold the supporting strength of the control board 302 in the housing 301, when a protective case is manufactured by the use of a mold, the wall part 304 needs to have a gradient for removing the mold and hence the protective case is increased in a width size, which hence causes such a concern that the electronic control unit (device) will be increased in size.

SUMMARY OF INVENTION

The present disclosure addresses the above issues. Thus, it is an objective of the present disclosure to provide an electronic control unit and a protective case that can secure the supporting strength of a control board in a housing and avoid a layout relating to setting parts from being complicated and contribute to miniaturizing a device.

To achieve the objective of the present disclosure, an electronic control unit in an aspect of the present disclosure includes a plate-shaped control board that includes an electronic control circuit mounted with electronic parts, a long pillar-shaped battery pack that receives a backup battery (BUB) capable of constantly supplying electric power to the electronic control circuit, and a housing that accommodates the control board and the battery pack.

The electronic control unit of the present disclosure further includes a battery holder that has a bent shape and includes a bottom surface along a longitudinal direction of the battery pack, the battery holder clamping a main body of the battery pack, and a fixing frame that includes a juxtaposing and mounting part on which a plate surface of the control board and the bottom surface of the battery holder are mounted in a state of being adjacent to each other with a boundary line along the longitudinal direction (longitudinal direction of the battery pack) therebetween, the control board and the battery holder being fixed to the juxtaposing and mounting part.

In such a configuration of the present disclosure, the housing includes an opening portion into which the juxtaposing and mounting part of the fixing frame is inserted, and a back side holding portion that holds the juxtaposing and mounting part at an inner back side of the housing opposed to the opening portion. The fixing frame further includes a sealing front part that closes the opening portion of the housing with the juxtaposing and mounting part accommodated in the housing and that is fixed to the housing in a state of closing the opening portion.

In this construction, in the case where the fixing frame is housed in the housing in the state where the control board and the battery holder are fixed to the juxtaposing and mounting part, the fixing frame is held by the back side holding portion of the housing and the sealing front part of the fixing frame is fixed to the housing, whereby the fixing frame can be supported from both sides opposite to each other in the housing and hence the supporting strength of the control board in the housing can be held.

Further, the control board and the battery holder (holder having the battery pack fixed thereto) are fixed to the fixing frame adjacently to each other in the state of being arranged side by side. Hence, for example, the housing can be formed in a rectangular shape, which hence eliminates the need for providing a dead space around the housing. Further, this can eliminate also the need for providing a wall part in the housing to partition a space in which the control board is arranged and a space in which the battery pack is arranged.

Hence, it is possible to secure the supporting strength of the control board in the housing and to avoid a layout relating to setting parts from being complicated and to contribute miniaturizing the device. In the present disclosure, the fixing frame may have any shape as long as it includes the juxtaposing and mounting part and the sealing front part. For example, the fixing frame may be formed in an L-shape. Specifically, the sealing front part may be formed integrally with the juxtaposing and mounting part so that the fixing frame has an L-shape.

According to this construction, it is possible to mold the fixing frame by the use of a mold and to eliminate the need for joining the juxtaposing and mounting part to the sealing front part later and hence to reduce a manufacturing step. Further, since the fixing frame is formed in the shape of a letter L, the juxtaposing and mounting part can be easily supported by the bottom surface in the housing and hence the fixing frame can be more suitably arranged in the housing.

In the present disclosure, the battery holder may include a wire mounting portion on which a wire (wire for the battery) is mounted. The wire connects together the electronic control circuit and the backup battery. The fixing frame may include an erect face portion that holds the wire mounting portion above a board mounting area of the juxtaposing and mounting part.

According to this construction, a battery wire can be arranged by the use of a vacant space above the board mounting area in the housing, so the battery wire can be suitably housed in the housing without increasing the width size of the housing (while the size of the device is securely reduced).

In the present disclosure, the sealing front part may include an opening portion through which the battery pack is inserted into the battery holder. Furthermore, in such a configuration, the unit may include a battery fixture that is attached to a tip portion of the battery pack and that closes an opening portion of the sealing front part with the main body of the battery pack clamped by the battery holder. This battery fixture may include a claw portion that is engaged with a rear surface of the opening portion of the sealing front part.

According to this construction, it is possible to easily replace the battery pack by using the battery fixture. Further, the claw portion of the battery fixture is retained by the rear surface side portion of the opening portion of the sealing front part, so that the battery pack can be prevented from falling off from the opening portion of the sealing front part. Hence, the holding performance of the battery pack in the housing can be improved and the interior of the housing can be suitably sealed because the battery fixture closes the opening portion of the sealing front part.

In this regard, according to the present disclosure, the protective case including the housing, the battery holder, and the fixing frame, which are described above, can be circulated in the market. In this case, the protective case constructs the electronic control unit together with the control board and the battery pack. Hence, it is possible to produce the same effect as the effect described above.

BRIEF DESCRIPTION OF DRAWINGS

The above and other objects, features and advantages of the present disclosure will become more apparent from the following detailed description made with reference to the accompanying drawings. In the drawings.

EMBODIMENT FOR CARRYING OUT INVENTION

Hereinafter, an electronic control unit as an embodiment will be described with reference to the drawings. Here, the electronic control unit of the present embodiment is constructed as an eCall unit that is set in a dashboard of a vehicle and that has a function of automatically transmitting information relating to the operation of an air bag when a vehicle accident is caused and the sensing information of a crash sensor, a GPC receiver or the like to a specified center by a radio transmission. Further, the electronic control unit of the present embodiment is set along with the other device and member in the dashboard of the vehicle and is set, in particular, under the duct of an air conditioner and hence is supposed to be necessarily operated without any problem even if the electronic control unit receives water drops leaking from the duct.

Figure 1:
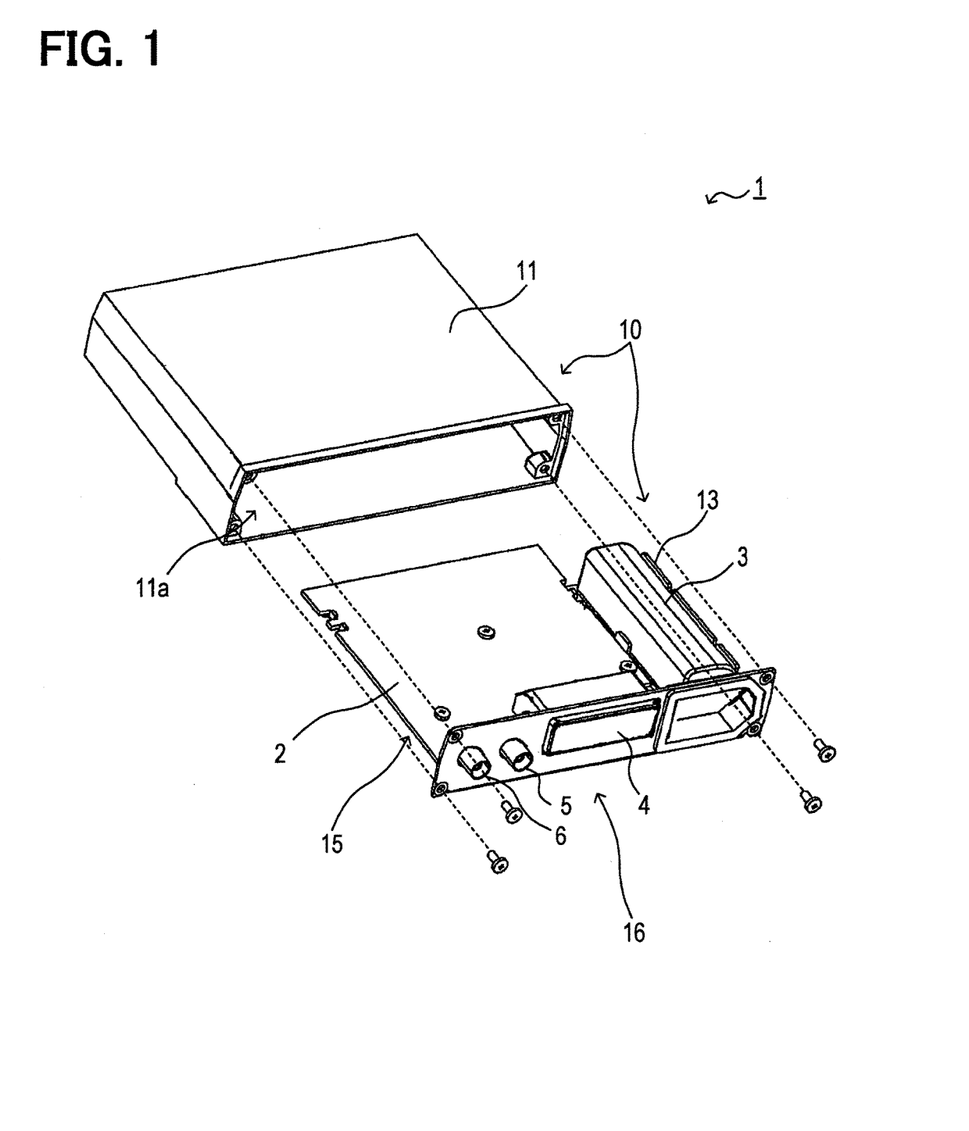
FIG. 1 is an exploded view, in perspective, to exemplify a general construction of an electronic control unit in an embodiment.

A general construction of an electronic control unit 1 of the present embodiment will be described. As shown in FIG. 1, the electronic control unit 1 is constructed of: a control board 2 having a plate shape; a battery pack 3 having a long cylindrical shape; and a protective case 10 that protects the control board 2 and the battery pack 3 from outside dust and dirt, water drops (in particular, water drops leaking from the duct of the air conditioner), and the like.

The control board 2 is a board to construct an electronic control circuit (not shown in the drawing) mounted with a plurality of electronic parts and has a plurality of connectors 4 to 6 connected to the electronic control circuit. In this regard, the electronic control circuit of the present embodiment has a microcomputer (not shown in the drawing) to perform a processing of realizing a function as the eCell unit. The microcomputer transmits radio signals, which show various kinds of information produced on the basis of the various kinds of signals inputted via at least one of the connectors 4 to 6, to an outside center via at least one of the connectors 4 to 6 by the radio communication.

In the present embodiment, a comparatively large rectangular connector 4 is a main connector and is connected to, for example, a device (air bag device) to expand an air bag, a crash sensor, or the like, and is used for acquiring information relating to the operation of the air bag (for example, whether or not the air bag is expanded) and the sensing information of the crash sensor (for example, an acceleration to show an impact applied to the vehicle). Further, of the comparatively small cylindrical connectors 5, 6, the connector 5 is connected to, for example, the GPS receiver and is used for acquiring the sensing information of the GPS receiver (for example, the present position of the vehicle), and the connector 6 is connected to a device (radio communication device) to make a radio communication to the outside center via a base station of a mobile phone network and is used for transmitting various kinds of information acquired via the connectors 4, 5 to the outside center by the radio communication.

The battery pack 3 is a part that receives a backup battery (BUB) capable of always supplying the electronic control circuit on the control board 2 with an electric power and that is shaped like a long cylinder. Here, the BUB (not shown in the drawing) may be a battery to supply the electronic control circuit with the electric power under any circumstances or may be a battery that is supplied and charged with the electric power from a vehicle-mounted battery when an engine of the vehicle is operated and that can continuously supply the electronic control circuit with the electric power for a specified time from when the engine of the vehicle is stopped or from when the supply of the electric power from the vehicle-mounted battery is stopped. In this regard, the BUB (not shown in the drawing) is a battery that is supposed to be included by the electronic control unit 1 in such a way as to be able to always supply the electronic control circuit with the electric power even in the event of an emergency, for example, when the supply of the electric power from the vehicle-mounted battery is stopped (in other words, so as to be able to transmit various kinds of information acquired via the connectors 3, 4 to the outside center by radio communication).

The protective case 10 is constructed of: a housing 11 to house the control board 2 and the battery pack 3; a battery holder 12 to hold the main body of the battery pack 3 (see FIG. 4); a fixing frame 13 to which the control board 2 and the battery holder 12 are fixed; and a battery fixture 14 fixed to a tip portion of the battery pack 3 (see FIG. 6 and FIG. 8).

The main body of the battery pack 3 is held by the battery holder 12 (see FIG. 4), and the fixing frame 13 is fixed to the housing 11 with screws or the like in the state where the battery holder 12 (and the battery fixture 14) and the control board 2 are held by the fixing frame 13, whereby the control board 2 and the battery holder 12 can be housed in the protective case 10 in the state of being held watertight.

The construction of parts of the protective case 10 will be described. The housing 11 is made by a metal mold casting method such as die casting and is formed in the shape of a box having an opening portion 11a into which a juxtaposing and mounting part 15 (which will be described later) of the fixing frame 13 is inserted. The opening portion 11a has screw holes formed at its four corners to which a sealing front part 16 (which will be described later) of the fixing frame 13 is connected with screws or the like.

Figure 2A:
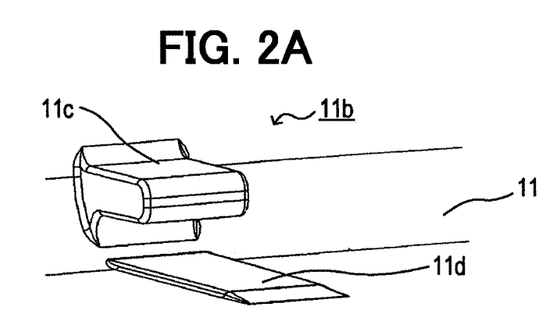
FIG. 2A is an illustrative view to exemplify a construction of a back side holding portion of a housing and an interior of the housing in the embodiment.
Figure 2B:
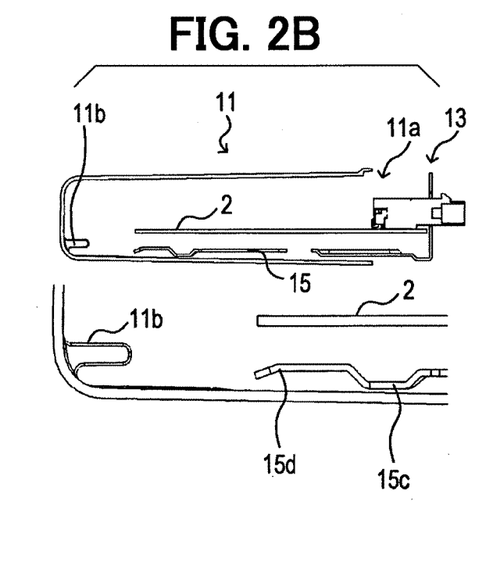
FIG. 2B is an illustrative view to exemplify a construction of a back side holding portion of a housing and an interior of the housing in the embodiment.
Figure 2C:
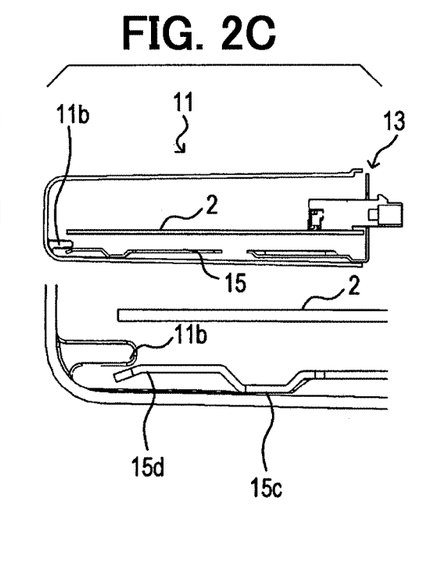
FIG. 2C is an illustrative view to exemplify a construction of a back side holding portion of a housing and an interior of the housing in the embodiment.
Figure 2D:
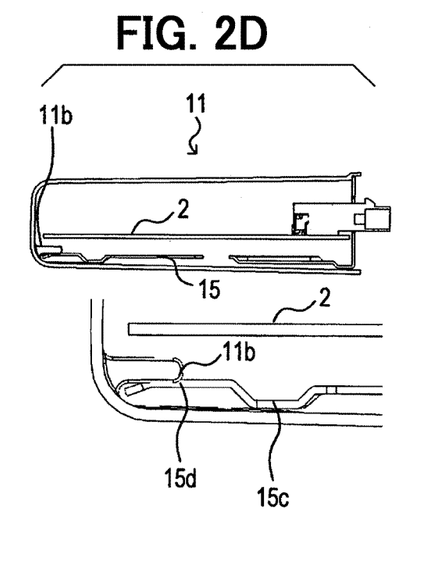
FIG. 2D is an illustrative view to exemplify a construction of a back side holding portion of a housing and an interior of the housing in the embodiment.

Further, as shown in FIG. 2A, and FIGS. 2B, 2C, and 2D, the housing 11 is constructed of one or a plurality of (three, in the present embodiment) back side holding portions 11b for holding the juxtaposing and mounting part 15 (which will be described later) of the fixing frame 13 on an inner back side of the housing 11 opposite to the opening portion 11a thereof (see FIG. 2B FIG. 2C FIG. 2D). For example, the back side holding portion 11b is constructed of: a protruding member 11c for biasing a tip portion (upper surface) of the juxtaposing and mounting part 15 of the fixing frame 13 from above on a lower side of an inner back face of the housing 11; and a guide member 11d for guiding the tip portion of the juxtaposing and mounting part 15 of the fixing frame 13 to the inner back face of the housing 11 and for supporting the tip portion (lower surface) of the juxtaposing and mounting part 15 of the fixing frame 13 from below.

Figures 3A, 3B, 3C:
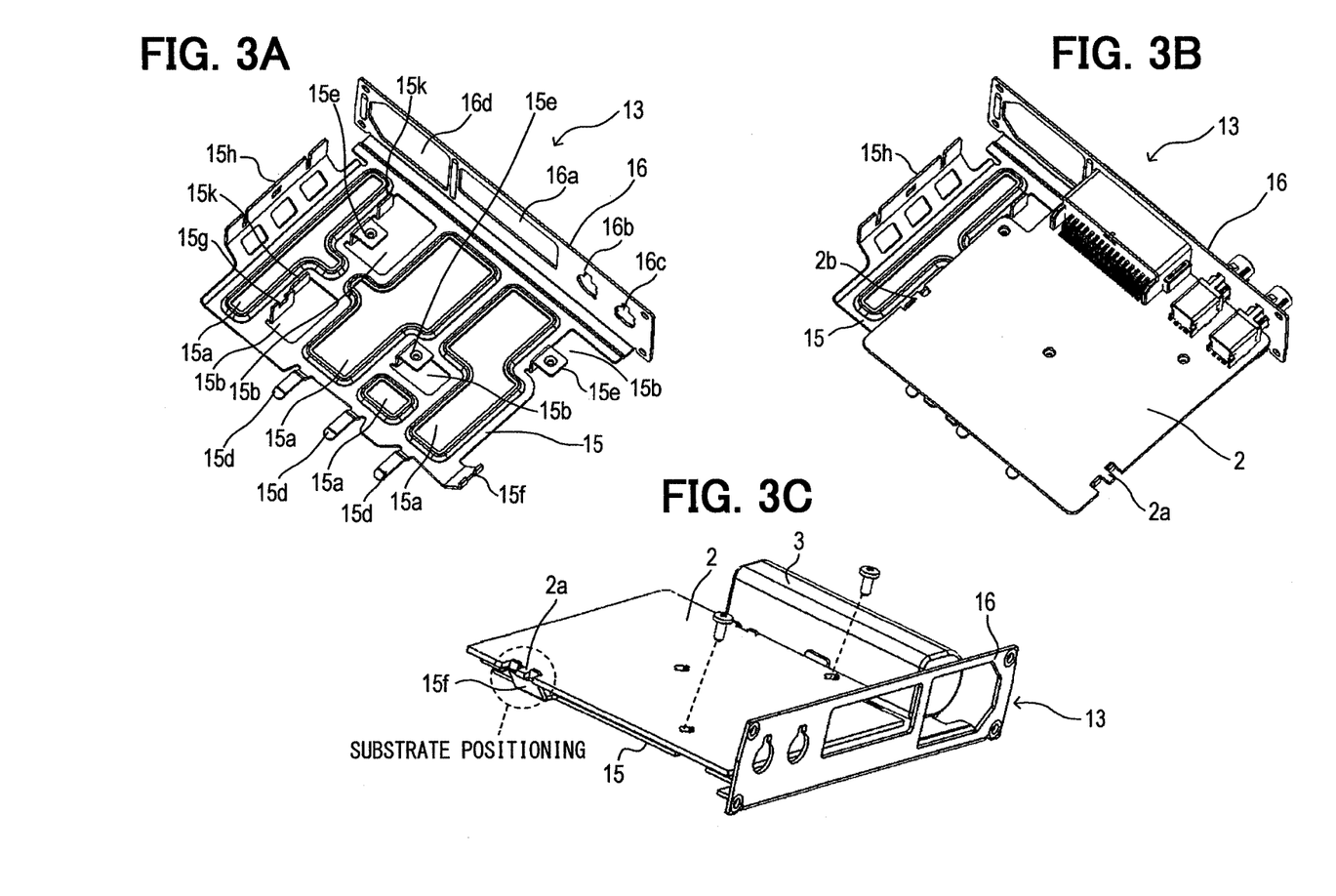
FIG. 3A is a perspective view to mainly exemplify a construction of a fixing frame in the embodiment.
FIG. 3B is a perspective view to mainly exemplify a construction of a fixing frame in the embodiment.
FIG. 3C is a perspective view to mainly exemplify a construction of a fixing frame in the embodiment.

Next, the fixing frame 13 is made by pressing or the like and, as shown in FIGS. 3A to 3C, is constructed of the juxtaposing and mounting part 15 and the sealing front part 16. The juxtaposing and mounting part 15 has a plate surface of the control board 2 and the battery pack 3 (to be exact, a bottom surface of the battery holder 12 (see FIG. 4)) mounted in the state of being adjacent to each other at a boundary along a longitudinal direction of the battery pack 3. The sealing front part 16 closes the opening portion 11a of the housing 11 in the state where the juxtaposing and mounting part 15 is housed in the housing 11 (see FIG. 1) and is fixed to the housing 11 in the state of closing the opening portion 11a.

In the juxtaposing and mounting part 15, as shown in FIG. 3A, a bottom surface includes: a plurality of bottom surface protruding portions 15a formed by embossing a rear face; a plurality of bottom surface opening portions 15b; and a bottom surface portion 15c other than the bottom surface protruding portions 15a and the bottom surface opening portions 15b, the bottom surface portion 15c being so constructed as to abut on an inner bottom surface of the housing 11, as shown in FIGS. 2B, 2C, and 2D.

Further, as shown in FIG. 3A, in the juxtaposing and mounting part 15, an end portion at a position on a side opposite to the sealing front portion 16 has one or a plurality of (three, in the present embodiment) tip protruding portions 15d biased from above by a protruding member 11c of the back side holding portion 11b provided on the inner back side of the housing 11. For this reason, as shown in FIGS. 2B, 2C, and 2D, when the tip portion of the juxtaposing and mounting part 15 is inserted to the inner back side of the housing 11, the tip protruding portions 15d of the juxtaposing and mounting part 15 is pressed from above by the protruding member 11c of the housing 11, and hence the bottom surface portion 15c of the juxtaposing and mounting part 15 is pressed from below by the guide member 11d of the housing 11, whereby the tip portion of the juxtaposing and mounting part 15 is held on the inner back side of the housing 11.

Still further, as shown in FIG. 3A, in the juxtaposing and mounting part 15, in order to fix a part of the control board 2 and the battery holder 12 (see FIG. 4), some of the bottom surface opening portions 15b have a plurality of erect face portions 15e formed at edge portions thereof, the erect face portion 15 being erected upward and having the plate surface of the control board 2 placed thereon. The erect face portion 15e is erected at a height to make a clearance between the bottom surface of the control board 2 and the tip protruding portion 15d (upper surface) of the juxtaposing and mounting part 15 and has a screw hole formed therein, the screw hole being used to connect the control board 2 to the erect face portion 15e with a screw or the like.

Further, as shown in FIG. 3A, in the juxtaposing and mounting part 15, in order to position the control board 2, an end portion positioned on a side opposite to an area in which the battery pack 3 (to be exact, the bottom surface of the battery holder 12 (see FIG. 4)) is mounted (hereinafter referred to as "a battery mounting area") has a first positioning portion 15f formed thereon, the first positioning portion 15f being erected obliquely upward and being fitted in a first clipped portion 2a (see FIG. 3B) previously formed at the edge of the control board 2. The first positioning portion 15f, as shown in FIG. 3C, is erected at an angle in which the screw holes of the erect face portions 15e match the screw holes of the control board 2. Further, in the juxtaposing and mounting part 15, the bottom surface opening portion 15b adjacent to the battery mounting area has a second positioning portion 15g erected thereon, the second positioning portion 15g having a second clipped portion 2b (see FIG. 3B) formed on a side opposite to an edge in which the first clipped portion 2a is positioned in the control board 2.

Further, as shown in FIG. 3A, in the juxtaposing and mounting part 15, in order to position the battery holder 12 (see FIG. 4), an end portion positioned on a side opposite to an area in which the control board 2 is mounted (hereinafter referred to as "a board mounting area") has a joint portion 15h formed thereon, the joint portion 15h being erected along the shape of the battery holder 12 and being joined to a side surface of the battery holder 12.

Figure 4A:
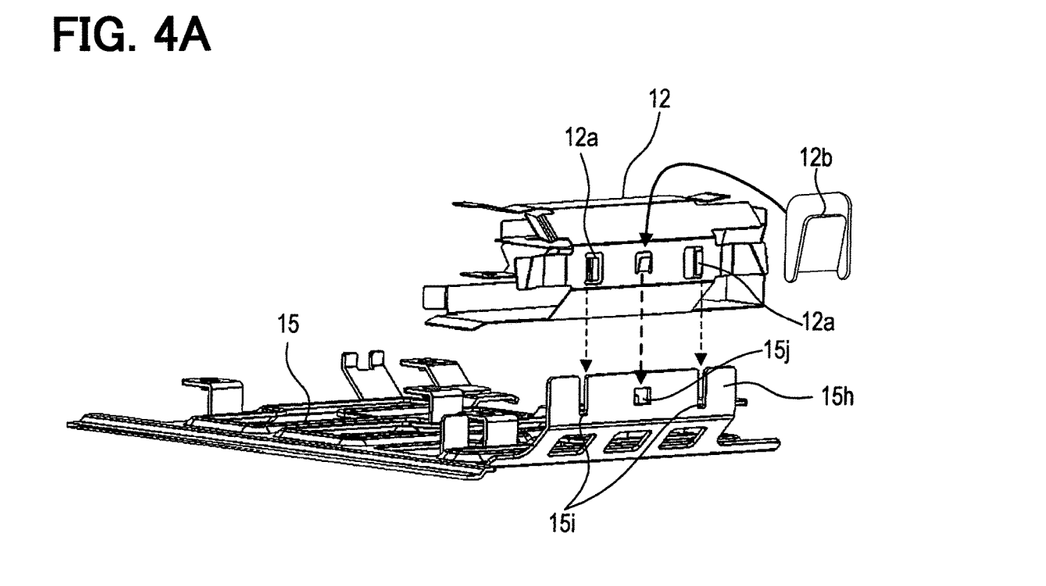
FIG. 4A is an illustration to show an example in which a battery holder is not yet fixed to a juxtaposing and mounting part of a fixing frame in the embodiment.
Figure 4B:
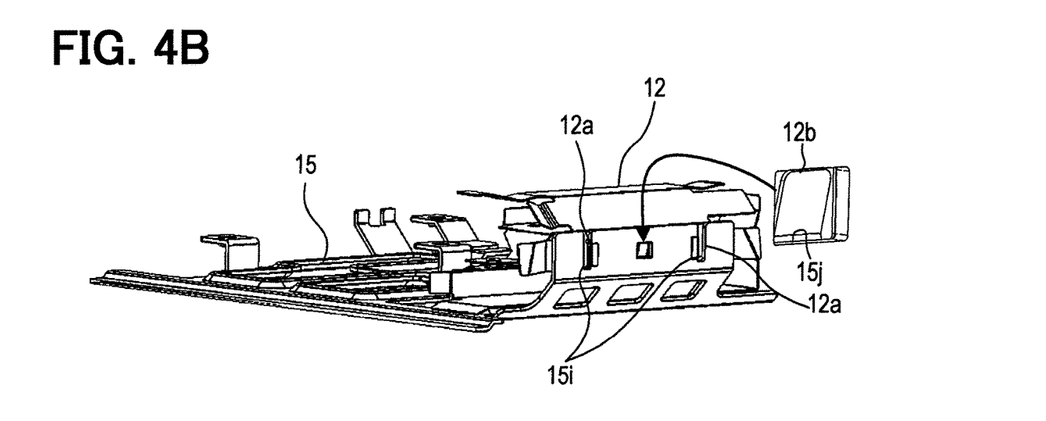
FIG. 4B is an illustration to show an example in which the battery holder is fixed to the juxtaposing and mounting part of the fixing frame in the embodiment.

Specifically, as shown in FIG. 4A, the battery holder 12 is bent in such a way that a face on the side on which the joint portion 15h of the juxtaposing and mounting part 15 abuts is formed in a shape having a plurality of faces. Further, of the plurality of faces on which the joint portion 15h of the juxtaposing and mounting part 15 abuts, a face vertical to the bottom surface has two longitudinally divided portions 12a and an erect portion 12b formed thereon, the longitudinally divided portions 12a protruding outward, the erect portion 12b being erected obliquely upward. The joint portion 15h of the juxtaposing and mounting part 15 has two slits 15i and a window portion 15j formed therein, the slits 15i having the longitudinally divided portions 12a of the battery holder 12 fitted therein, the window portion 15j having the erect portion 12b of the battery holder 12 fitted therein. In other words, as shown in FIG. 4B, when the battery holder 12 is pressed in the juxtaposing and mounting part 15 in such a way that the longitudinally divided portions 12a of the battery holder 12 are fitted in the slits 15i of the juxtaposing and mounting part 15, the erect portion 12b of the battery holder 12 is engaged with the window portion 15j of the juxtaposing and mounting part 15, whereby the battery holder 12 is locked in such a way as not to be removed from the juxtaposing and mounting part 15 (fixing frame 13). In this regard, the longitudinally divided portions 12a of the battery holder 12 can be bent along the side face of the joint portion 15h of the juxtaposing and mounting part 15 in the state where the erect portion 12b of the battery holder 12 is engaged with the window portion 15j of the juxtaposing and mounting part 15.

Further, as shown in FIG. 3A, an edge portion of the bottom surface opening portion 15b positioned along the boundary between the board mounting area and the battery mounting area in the juxtaposing and mounting part 15 has the erect face portions 15e and a plurality of (two, in the present embodiment) flanges 15k formed thereon, the erect face portions 15e supporting a part of the control board 2 and the battery holder 12, the flanges 15k being abutted on the side face (face A) of the battery holder 12.

Figure 5A:
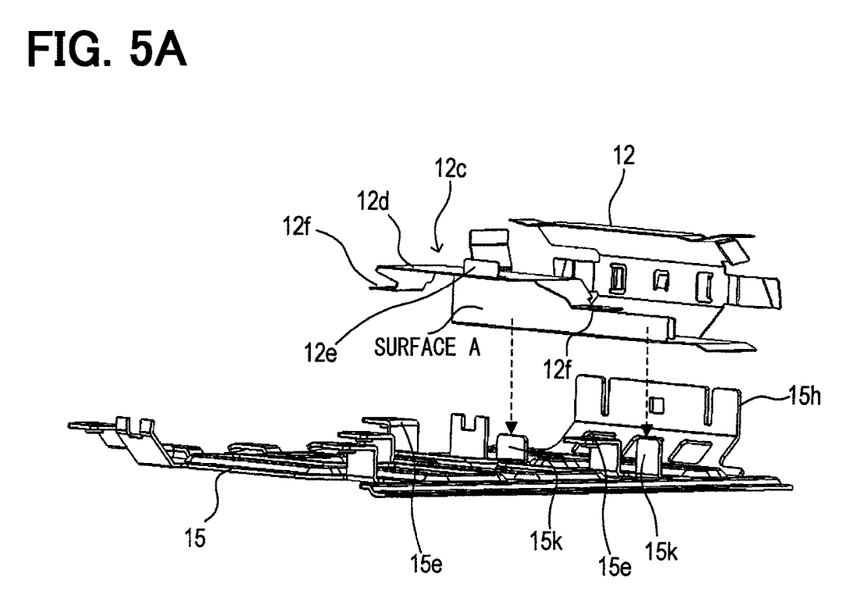
FIG. 5A is an illustration to show an example in which a battery holder is not yet fixed to a juxtaposing and mounting part of a fixing frame in the embodiment.
Figure 5B:
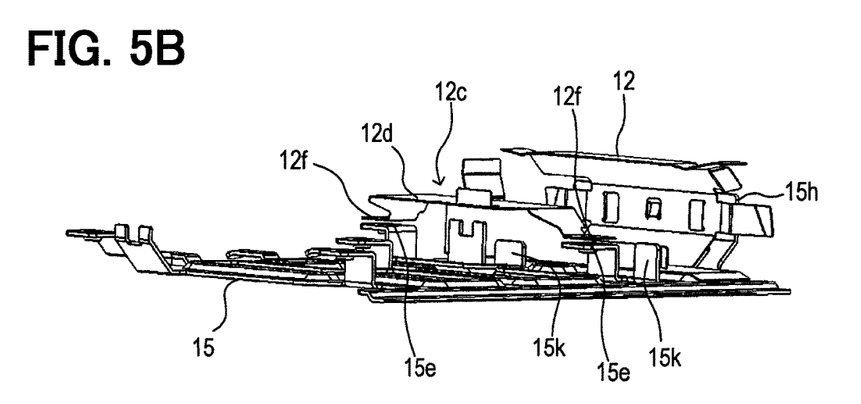
FIG. 5B is an illustration to show an example in which the battery holder is fixed to the juxtaposing and mounting part of the fixing frame in the embodiment.

Specifically, as shown in FIG. 5A, the battery bolder 12 has a wire mounting portion 12c in which a wire 3a (see FIG. 6) to connect the electronic control circuit on the control board 2 (see FIG. 3) to the BUB in the battery pack 3 (see FIG. 3) is mounted. The wire mounting portion 12c is bent to have a parallel face 12d, a restraining portion 12e, and mounting faces 12f. The parallel face 12d protrudes to a board mounting area side of the juxtaposing and mounting part 15. The restraining portion 12e is erected at an edge of the parallel face 12d so as to restrain the wire 3a from moving to a board mounting area side. The mounting faces 12f are extended obliquely downward from both ends of the parallel face 12d and are mounted on the erect face portions 15e of the juxtaposing and mounting part 15. The erect face portions 15e of the juxtaposing and mounting part 15 are formed at positions to support the mounting faces 12f of the wire mounting portion 12c from below so as to hold the parallel face 12d of the wire mounting portion 12c above the board mounting area in the juxtaposing and mounting part 15. Further, the flanges 15k of the juxtaposing and mounting part 15 are formed at positions abutting on the side face (face A) of the battery holder 12 in such a way that the battery holder 12 is not moved to the board mounting area side in the juxtaposing and mounting part 15. In short, as shown in FIG. 5B, when the battery holder 12 is joined to the joint portion 15h of the juxtaposing and mounting part 15, the side face (face A) of the battery holder 12 is abutted on the flanges 15k of the juxtaposing and mounting part 15 and the mounting faces 12f of the battery holder 12 are mounted on the erect face portions 15e of the juxtaposing and mounting part 15, whereby the wire mounting portion 12c is held above the board mounting area of the juxtaposing and mounting part 15. In this regard, the mounting faces 12f of the battery holder 12 and the erect face portions 15e of the juxtaposing and mounting part 15 are fixed to each other with screws or the like in the state of sandwiching the control board 2 (see FIG. 3).

Figure 6A:
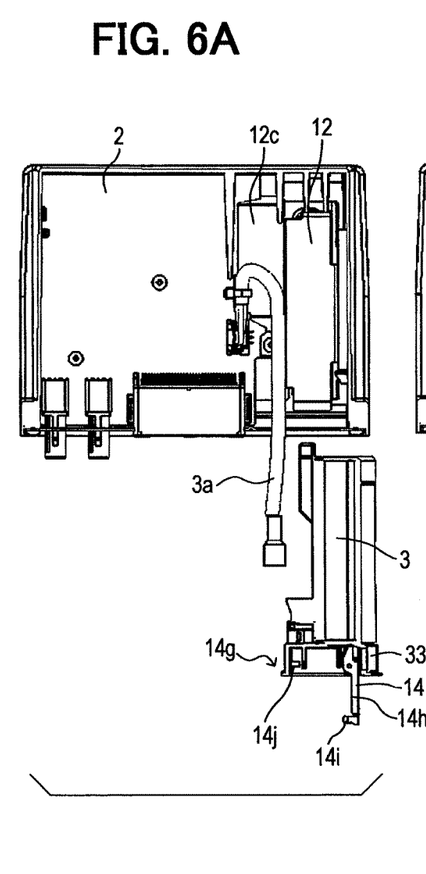
FIG. 6A is a top view to show an example in which a battery pack is housed in a protective case in the embodiment.
Figure 6B:
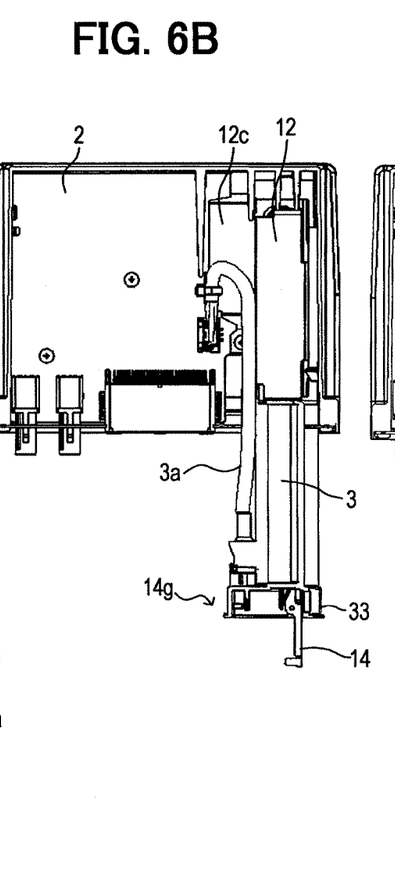
FIG. 6B is a top view to show an example in which the battery pack is housed in the protective case in the embodiment.
Figure 6C:
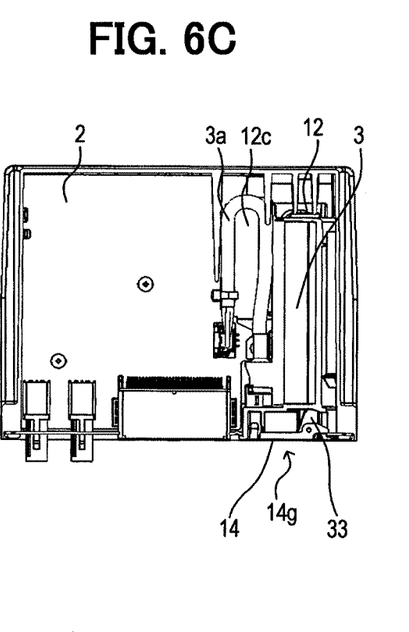
FIG. 6C is a top view to show an example in which the battery pack is housed in the protective case in the embodiment.

Here, in the wire mounting portion 12c of the battery holder 12, as shown in FIG. 6A, the wire 3a has its one end mounted in the state of being connected to the electronic control circuit on the control board 2 and, as shown in FIG. 6B, has the other end connected to a connection portion of the battery pack 3 that can be removed from the battery holder 12, whereby the wire 3a can be electrically conducted to the BUB in the battery pack 3. In other words, in the wire mounting portion 12c of the battery holder 12, the wire 3a can be connected to the battery pack 3 removed from the battery holder 12 and, as shown in FIG. 6C, there is secured a space in which the wire 3a connected to the BUB in the battery pack 3 is received in the state where the battery pack 3 is received in the battery holder 12.

Next, the sealing front part 16 of the fixing frame 13 is formed integrally with the juxtaposing and mounting part 15 in such a way that the fixing frame 13 is shaped like a letter L as a whole. The sealing front part 16, as shown in FIGS. 3A to 3C, has fitted-in portions 16a, 16b, 16c in which the connectors 4 to 6 on the control board 2 are fitted from the juxtaposing and mounting part 15 side (reverse surface side of the sealing front part 16) and an opening portion 16d formed in such a way that the battery pack 3 is inserted into the battery holder 12.

Here, in the sealing front part 16, as described above, are formed screw holes that are arranged in such a way as to match the screw holes formed at four corners of the opening portion 11a of the housing 11 in the state where the battery holder 12 (and the battery fixture 14) and the control board 2 are fixed to the juxtaposing and mounting part 15 and where the juxtaposing and mounting part 15 is housed in the housing 11. As shown in FIG. 1, when the sealing front part 16 is screwed in the state in which the screw holes match the screw holes at the four corners of the opening 11a of the housing 11, the sealing front part 16 is fixed to the opening 11a of the housing 11.

Further, the opening portion 16d of the sealing front part 16 is formed in such a way that when the battery pack 3 is set in the battery holder 12, a cover part 33 of the battery pack 3 is fitted in from an obverse side of the sealing front part 16.

Figure 7A:
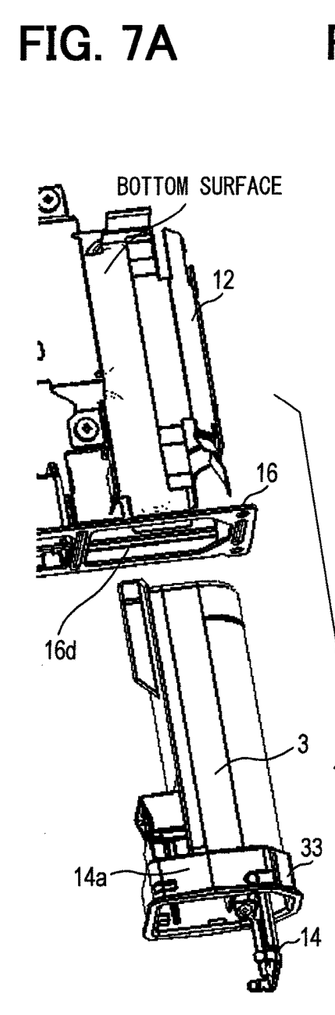
FIG. 7A is a perspective view to show an example in which a battery pack is housed in a protective case in the embodiment.
Figure 7B:
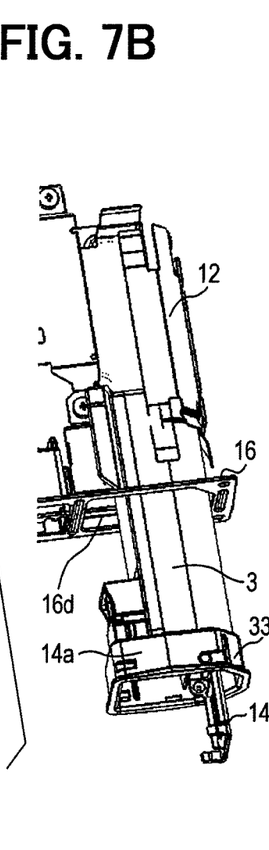
FIG. 7B is a perspective view to show an example in which the battery pack is housed in the protective case in the embodiment.
Figure 7C:
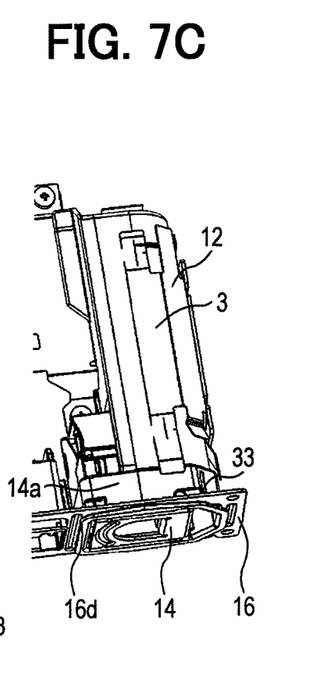
FIG. 7C is a perspective view to show an example in which the battery pack is housed in the protective case in the embodiment.

A specific assembling procedure will be shown in order of FIG. 7A to FIG. 7C. That is, as shown in FIG. 7A, the battery holder 12 has a bottom surface along the longitudinal direction of the battery pack 3. On the other hand, the battery fixture 14 is fitted on the cover part 33 of the battery pack 3, whereby the battery fixture 14 is fixed to the cover part 33 of the battery pack 3. Here, as shown in FIG. 7B, when the main body of the battery pack 3 is inserted into the battery holder 12 and is pushed in to the inner back side of the battery holder 12, as shown in FIG. 7C, a side peripheral face 14a connected to the cover part 33 of the battery pack 3 is fitted in the opening portion 16d of the sealing front part 16.

Figure 8A:
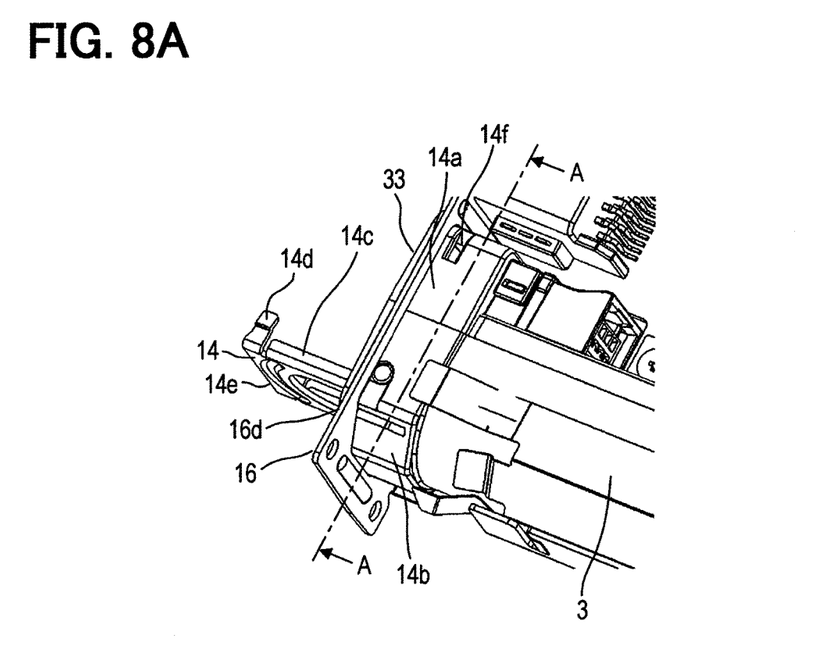
FIG. 8A is a perspective view to exemplify a construction of a battery fixture in the embodiment.

In more detail, as shown in FIG. 8A, the battery pack 3 is constructed of the side peripheral face 14a connected to the cover part 33 and a fixing frame portion 14b to fix the battery fixture 14 inside. On the other hand, the battery fixture 14 is constructed of: a journal end journaled by the fixing frame portion 14b of the battery pack 3; a turning door portion 14c turning around the journal end; and a stopper 14d provided on the turning door portion 14c and retained by the fixing frame portion 14b of the battery pack 3.

Figure 8B:
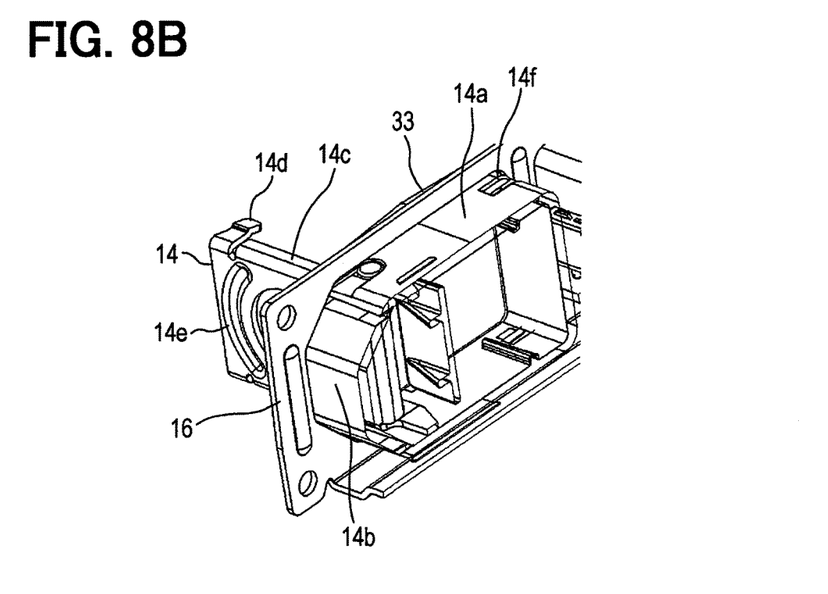
FIG. 8B is a perspective view having a section A-A in FIG. 8A to exemplify the construction of the battery fixture in the embodiment.

The fixing frame portion 14b of the battery pack 3, as shown in FIG. 8B, has its inner peripheral wall face worked in a shape to be fitted in the main body of the battery pack 3 and has its outer peripheral wall face worked in a shape in which the opening portion 16d of the sealing front part 16 is fitted in the side peripheral face 14a.

Figure 9A:
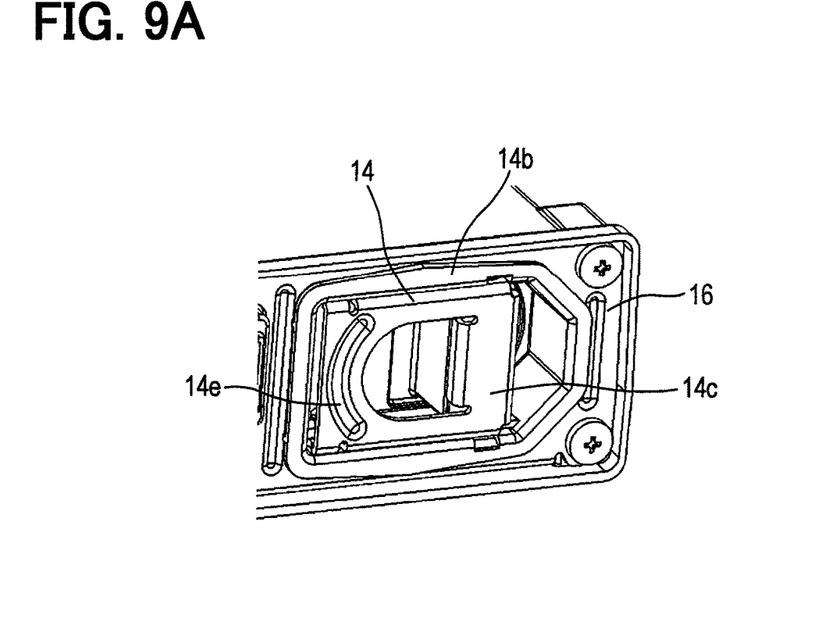
FIG. 9A is a front view to exemplify a construction of a battery fixture in the embodiment.
Figure 9B:
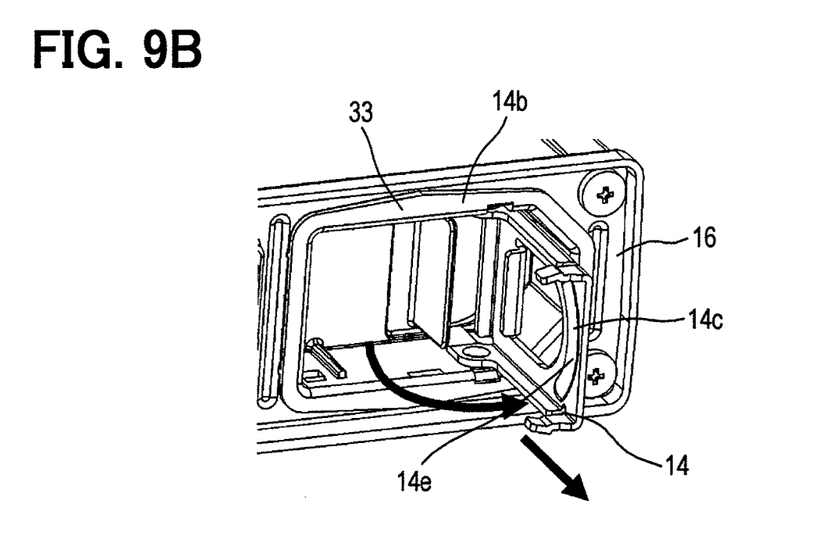
FIG. 9B is a front view to exemplify the construction of the battery fixture in the embodiment.

The turning door portion 14c of the battery fixture 14, as shown in FIGS. 9A and 9B, is journaled at upper and lower positions shifted from its center to one end in the fixing frame portion 14b of the battery pack 3. When a user opens a lever 14e fixed on a side opposite to the journal end, the user can pull out the battery pack 3 including the fixing frame portion 14b from the battery holder 12.

Further, when the user closes the lever 14e, the turning door portion 14c of the battery fixture 14 is fixed to the opening portion 16d of the sealing front part 16. Specifically, as shown in FIGS. 8A and 8B, the fixing frame portion 14b of the battery pack 3 has a fitting aperture 14f formed therein, the fitting aperture 14f having the stopper 14d fitted therein on the rear surface side of the opening portion 16d of the sealing front part 16, and when the stopper 14d of the battery fixture 14, which is protruded in such a way as to be able to slide toward the fitting aperture 14f at the upper and lower positions corresponding to the lever 14e in the turning door portion 14c of the battery fixture 14, is fitted in the fitting aperture 14f, the turning door portion 14c of the battery fixture 14 and the fixing frame portion 14b of the battery pack 3 are coupled to each other.

Further, the battery fixture 14 has a lock mechanism 14g to couple the fixing frame portion 14b of the battery pack 3 to the sealing front part 16 in the state where the side peripheral face 14a of the fixing frame portion 14b of the battery pack 3 is fitted in the opening portion 16d of the sealing front part 16. Specifically, as shown in FIGS. 6A to 6C, the lock mechanism 14g is provided on the upper surface of the fixing frame portion 14b (side peripheral face 14a) of the battery pack 3 and is constructed of: a turning member 14h turning around the journal end of the fixing frame portion 14b of the battery pack 3 above the turning door portion 14c; a claw portion 14i provided at a tip portion of the turning member 14h; and a stepped portion 14j provided at a position corresponding to the claw portion 14i on the upper surface of the fixing frame portion 14b (side peripheral face 14a) of the battery pack 3.

The lock mechanism 14g has a protruding portion at the tip of the claw portion 14i, and when the user turns the turning member 14h toward the opening portion 16 of the sealing front part 16 in the state where the side peripheral face 14a of the fixing frame portion 14b of the battery pack 3 is fitted in the opening portion 16d of the sealing front part 16, the claw portion 14i of the turning member 14h climbs up the stepped portion 14j of the fixing frame portion 14b of the battery pack 3. At this time, the protruding portion of the claw portion 14i is retained by the rear surface of the opening portion 16d of the sealing front part 16, whereby the fixing frame portion 14b and the sealing front part 16 are coupled to each other.

The effect of the present embodiment will be described. As described above, the electronic control unit 1 of the present embodiment includes the battery holder 12 and the fixing frame 13. The battery holder 12 has the bottom surface along the longitudinal direction of the battery pack 3 and has the curved shape to sandwich the main body of the battery pack 3. The fixing frame 13 has the juxtaposing and mounting part 15 on which the plate surface of the control board 2 and the bottom surface of the battery holder 12 mounted thereon in the state of being adjacent each other at the boundary along the longitudinal direction of the battery pack 3, the juxtaposing and mounting part 15 having the control board 2 and the battery holder 12 fixed thereto.

In the electronic control unit 1, the housing 11 has the opening portion 11a into which the juxtaposing and mounting part 15 of the fixing frame 13 is inserted and the back side holding portion 11b that holds the juxtaposing and mounting part 15 on the inner back side of the housing 11 opposite to the opening portion 11a, whereas the fixing frame 13 further has the sealing front part 16 that closes the opening portion 11a of the housing 11 in the state where the juxtaposing and mounting part 15 is housed in the housing 11 and that is fixed to the housing 11 in the state of closing the opening portion 11a.

In the construction like this, in the case where the fixing frame 13 is housed in the housing 11 in the state where the control board 2 and the battery holder 12 are fixed to the juxtaposing and mounting part 15, the fixing frame 13 is held by the back side holding portion 11b of the housing 11 and the sealing front part 16 of the fixing frame 13 is fixed by the housing, whereby the fixing frame 13 is supported from both sides opposite to each other in the housing 11 and hence the supporting strength of the control board 2 in the housing 11 can be held.

Further, the fixing frame 13 has the control board 2 and the battery pack 3 fixed thereto adjacently to each other in the state of being arranged side by side. Hence, the housing 11 can be formed in a rectangular shape, which hence eliminates the need for providing a dead space around the housing 11. Further, this can eliminates the need for providing a wall to partition a space in which the control board 2 is arranged and a space in which the battery pack 3 is arranged.

Hence, it is possible to secure the supporting strength of the control board 2 in the housing 11 and to avoid a layout relating to setting the parts from being complicated and to contribute to miniaturizing the device.

In this regard, in the electronic control unit 1, the sealing front part 16 of the fixing frame 13 is formed integrally with the juxtaposing and mounting part 15 in such a way that the fixing frame 13 is shaped like a letter L, so the fixing frame 13 can be molded by the use of the mold, which hence eliminates the need for joining the juxtaposing and mounting part 15 to the sealing front part 16 later and can reduce a manufacturing step. Further, the fixing frame 13 is formed in the shape of a letter L, so that the fixing frame 13 can be more suitably arranged in the housing so as to easily support the juxtaposing and mounting part 15 by the bottom surface in the housing 11.

Further, in the electronic control unit 1, the battery holder 12 has the wire mounting portion 12c on which the wire 3a for connecting the electronic control circuit to the BUB is mounted, and the fixing frame 13 has the erect face portions 15e that hold the wire mounting portion 12c above the board mounting area of the juxtaposing and mounting part 15.

For this reason, the wire 3a can be arranged in the housing 11 by the use of a vacant space above the board mounting area. Hence, the wire 3a can be suitably housed in the housing 11 without increasing the width size of the housing 11 (while the device is securely reduced in size).

Further, in the electronic control unit 1, the sealing front part 16 of the fixing frame 13 has the opening portion 16d through which the battery pack 3 is inserted into the battery holder 12. The sealing front part 16 has the battery fixture 14 that is fixed to the tip portion of the battery pack 3 and that closes the opening portion 16d of the sealing front part 16 in the state where the main body of the battery pack 3 is sandwiched by the battery holder 12. The battery fixture 14 has the claw portion 14i retained by the rear surface of the opening portion 16d of the sealing front part 16.

For this reason, the battery pack 3 can be easily replaced by the use of the battery fixture 14. Further, the claw portion 14i of the battery fixture 14 is retained by the rear surface of the opening portion 16d of the sealing front part 16, which hence can prevent the battery pack 3 from falling off from the opening portion 16d of the sealing front part 16. Hence, it is possible to improve the holding performance of the battery pack 3 in the housing 11 and to suitably seal the interior of the housing 11 because the battery fixture 14 closes the opening portion 16d of the sealing front part 16.

Modified examples of the embodiment will be described. Up to this point, the embodiment has been described. However, the present disclosure is not limited to the embodiment described above but can be performed in various modes within a range not departing from the gist of the present disclosure.

For example, in the electronic control unit 1 of the embodiment described above, the fixing frame 13 is formed in the shape of a letter L but is not limited to this shape. If the fixing frame 13 has a construction having the juxtaposing and mounting part 15 and the sealing front part 16, the fixing frame 13 may be formed in any shape.

Further, in the electronic control unit 1 of the embodiment described above has been described an example in which the sealing front part 16 of the fixing frame 13 is fixed to the opening portion 11a of the housing 11 with screws. However, the present disclosure is not limited to this example but, for example, the sealing front part 16 of the fixing frame 13 may be joined to the opening portion 11a of the housing 11 with snap fit.

Still further, in the electronic control unit 1 of the embodiment has been described an example in which the control board 2 is fixed to the juxtaposing and mounting part 15 of the fixing frame 13 with screws. However, the present disclosure is not limited to this example but, for example, the control board 2 may be joined to the juxtaposing and mounting part 15 of the fixing frame 13 with snap fit.

In this regard, in the embodiment described above has been described an example in which the protective case 10 constructs the eCall unit as the electronic control unit 1. However, the present disclosure is not limited to this example but the protective case 10 can be applied as a case to construct various electronic control units.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. An electronic control unit comprising:
   a plate-shaped control board that includes an electronic control circuit mounted with electronic parts;
   a long pillar-shaped battery pack that receives a backup battery capable of constantly supplying electric power to the electronic control circuit;
   a housing that accommodates the control board and the battery pack;
   a battery holder that has a bent shape and includes a bottom surface along a longitudinal direction of the battery pack, wherein the battery holder clamps a main body of the battery pack; and
   a fixing frame that includes a juxtaposing and mounting part on which a plate surface of the control board and the bottom surface of the battery holder are mounted in a state of being adjacent to each other with a boundary line along the longitudinal direction therebetween, wherein the control board and the battery holder are fixed to the juxtaposing and mounting part, wherein:
   the housing includes:
   an opening portion into which the juxtaposing and mounting part of the fixing frame is inserted; and
   a back side holding portion that holds the juxtaposing and mounting part at an inner back side of the housing opposed to the opening portion; and
   the fixing frame further includes a sealing front part that closes the opening portion of the housing with the juxtaposing and mounting part accommodated in the housing and that is fixed to the housing in a state of closing the opening portion; wherein
   the battery holder includes a wire mounting portion on which a wire is mounted;
   the wire connects together the electronic control circuit and the backup battery; and
   the fixing frame includes an erect face portion that holds the wire mounting portion above a board mounting area of the juxtaposing and mounting part on which the plate surface of the control board is mounted.

2. The electronic control unit according to claim 1, wherein the sealing front part is formed integrally with the juxtaposing and mounting part so that the fixing frame has an L-shape.

3. An electronic control unit comprising:
   a plate-shaped control board that includes an electronic control circuit mounted with electronic parts;
   a long pillar-shaped battery pack that receives a backup battery capable of constantly supplying electric power to the electronic control circuit;
   a housing that accommodates the control board and the battery pack;
   a battery holder that has a bent shape and includes a bottom surface along a longitudinal direction of the battery pack, wherein the battery holder clamps a main body of the battery pack; and
   a fixing frame that includes a juxtaposing and mounting part on which a plate surface of the control board and the bottom surface of the battery holder are mounted in a state of being adjacent to each other with a boundary line along the longitudinal direction therebetween, wherein the control board and the battery holder are fixed to the juxtaposing and mounting part, wherein:
   the housing includes:
   an opening portion into which the juxtaposing and mounting part of the fixing frame is inserted; and
   a back side holding portion that holds the juxtaposing and mounting part at an inner back side of the housing opposed to the opening portion; and
   the fixing frame further includes a sealing front part that closes the opening portion of the housing with the juxtaposing and mounting part accommodated in the housing and that is fixed to the housing in a state of closing the opening portion; wherein
   the sealing front part includes an opening portion through which the battery pack is inserted into the battery holder, the unit further comprising a battery fixture that is attached to a tip portion of the battery pack and that closes an opening portion of the sealing front part with the main body of the battery pack clamped by the battery holder, wherein the battery fixture includes a claw portion that is engaged with a rear surface of the opening portion of the sealing front part.

4. The electronic control unit according to claim 3, wherein the sealing front part is formed integrally with the juxtaposing and mounting part so that the fixing frame has an L-shape.

* * * * *